US006586933B1

(12) United States Patent
Hardy et al.

(10) Patent No.: US 6,586,933 B1
(45) Date of Patent: Jul. 1, 2003

(54) METHOD AND SYSTEM FOR MRI WITH LIPID SUPPRESSION

(75) Inventors: Christopher Judson Hardy, Niskayuna, NY (US); William Thomas Dixon, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,804

(22) Filed: May 15, 2002

(51) Int. Cl.[7] .................................................. G01V 3/00
(52) U.S. Cl. ........................................ 324/307; 324/309
(58) Field of Search ................................. 324/307, 309, 324/300, 314, 312, 318, 322

(56) References Cited

U.S. PATENT DOCUMENTS

| 5,111,143 | A | * | 5/1992 | McKinnon et al. | .......... 324/307 |
|---|---|---|---|---|---|
| 5,270,652 | A |   | 12/1993 | Dixon et al. | ................ 324/309 |
| 6,016,057 | A |   | 1/2000 | Ma | ............................ 324/309 |
| 6,307,368 | B1 |  | 10/2001 | Vasanawala et al. | ......... 324/309 |
| 6,373,249 | B1 | * | 4/2002 | Kwok et al. | ................. 324/306 |

OTHER PUBLICATIONS

ME Stromski, HR Brady, SR Gullans and S. Patz, "Application of Missing Pulse Steady State Free Precession To The Study Of Renal Microcirculation," Magnetic Resonance in Medicine 20, pp. 66–77, (1991).

S. Patz, STS Wong, and MS Roos, "Missing Pulse Steady–State Free Precession," Magnetic Resonance in Medicine 10, pp. 194–209, (1989).

* cited by examiner

Primary Examiner—Louis Arana
(74) Attorney, Agent, or Firm—Jean K. Testa; Patrick K. Patnode

(57) ABSTRACT

A method and system are provided for acquiring images with water and lipid separation using a magnetic resonance imaging (MRI) system comprising applying a plurality of steady-state free precession (SSFP) radio-frequency (RF) excitation pulses having respective amplitudes that correspond substantially to a binomial distribution to discriminate lipids from water.

26 Claims, 4 Drawing Sheets

METHOD AND SYSTEM FOR MRI WITH LIPID SUPPRESSION

BACKGROUND OF INVENTION

The present invention relates generally to magnetic resonance imaging (MRI), and more particularly to a system and method for water and fat separation in MRI pulse sequences employing steady-state free precession.

MRI pulse sequences that take advantage of steady-state free precession (SSFP), e.g. Siemens' "True-FISP", General Electric's "FIESTA", and Phillip's "Balanced FFE", allow fast imaging without excessive saturation of signals. In practice, SSFP is extremely useful for rapid imaging with relatively high signal-to-noise ratio of fluids such as blood. However, these sequences tend to produce bright fat signals which are in many cases undesirable, especially for instance when imaging the coronary arteries.

Various methods have been used to discriminate fat from water during SSFP imaging. Fluctuating equilibrium sequences, which adjust pulse phases in multiple images, can separate fat and water. Fat saturation has also been accomplished in SSFP with proper spin-preparation during periodic interruption with fat-saturation pulses. Interleaving fat-saturation pulses into the pulse sequence can disturb the steady-state equilibrium and affect water signals undesirably and, since not all parts of k-space are equally affected, can spread remaining fat signal to fat-free regions of the image. A method is needed for suppressing fat signals in steady-state free precession pulse sequences without the use of separate fat-saturation pulses.

SUMMARY OF INVENTION

In a first aspect, a method is provided for acquiring images with water and lipid separation using a magnetic resonance imaging (MRI) system. This method comprises applying a plurality of steady-state free precession (SSFP) radio-frequency (RF) excitation pulses having respective amplitudes that correspond substantially to a binomial distribution to discriminate lipids from water.

In a second aspect, a system for Magnetic Resonance Imaging (MRI) for acquiring images of an object is provided. The system comprises a magnetic field driver for driving a field gradient, a magnetic field controller for controlling the magnetic field, a transmitter for generating an radio frequency (RF) pulse to cause resonance and wherein the transmitter is adapted to generate a plurality of steady-state free precession (SSFP) radio-frequency excitation pulses having respective amplitudes that correspond substantially to a binomial distribution to discriminate lipids from water, a receiver for receiving and detecting magnetic resonance signals generated from the object, and a processor for performing image reconstruction and for generating images for display.

BRIEF DESCRIPTION OF DRAWINGS

The features and advantages of the present invention will become apparent from the following detailed description of the invention when read with the accompanying drawings in which.

DETAILED DESCRIPTION

Figure 1:
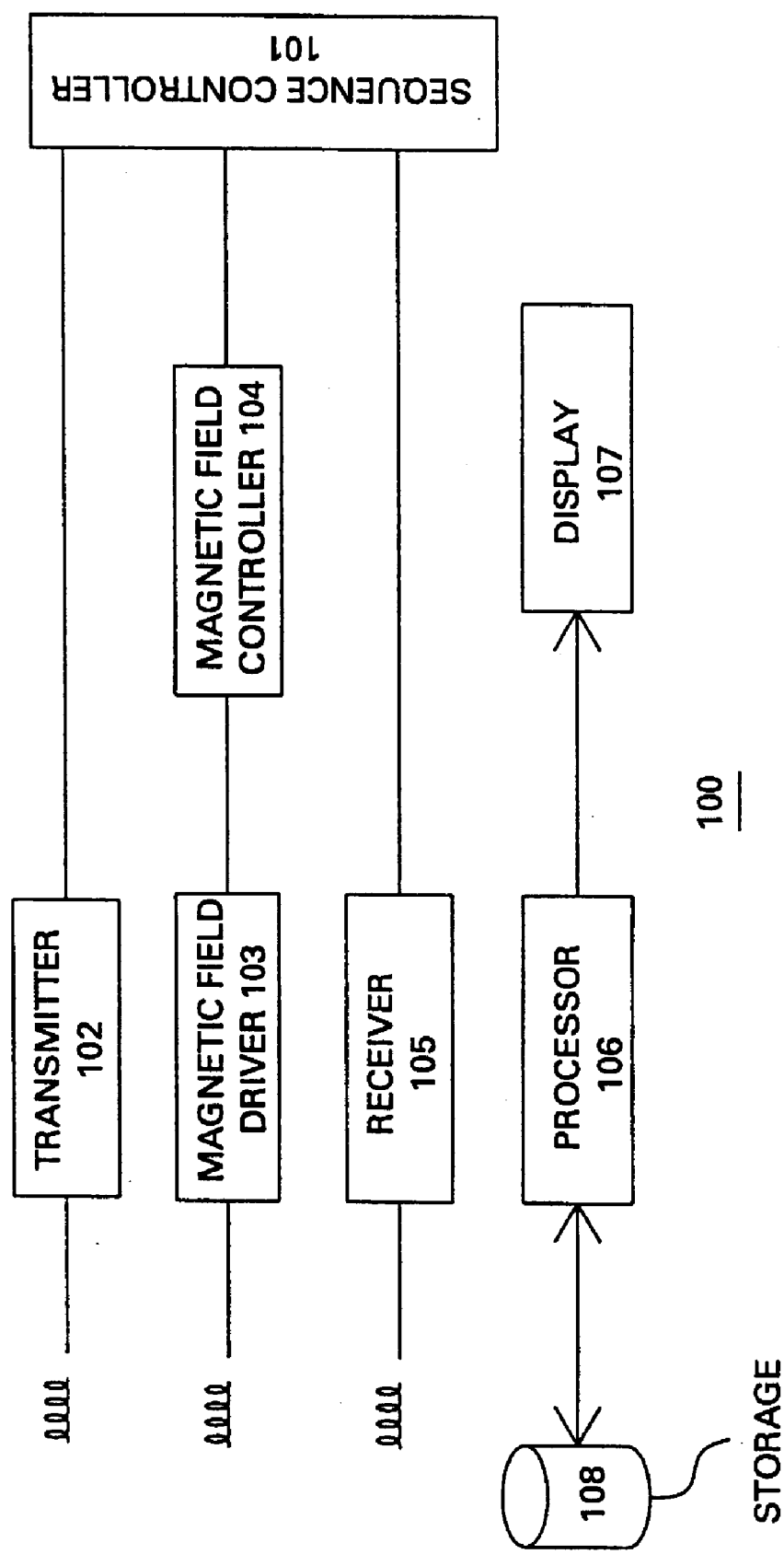
FIG. 1 is a block diagram of a Magnetic Resonance Imaging (MRI) system to which embodiments of the present invention are applicable.

Referring to FIG. 1, there is shown a block diagram of a magnetic resonance imaging (MRI) system for which embodiments of the present invention are applicable. The MRI system 100 comprises a sequence controller 101 for controlling various components of the system, as is well-known, for detecting magnetic resonance signals from the part of an object being imaged; a transmitter 102 for generating a radio frequency (RF) pulse to cause resonance; a magnetic field driver 103 for driving a field gradient in a known manner; a magnetic field controller 104 for controlling the magnetic field; a receiver 105 for receiving and detecting magnetic resonance signals generated from the object; a processor 106 for performing image reconstruction and various calculations for system operation; a display 107 for displaying images; and a peripheral memory device 108 for storing detected signal data and reconstructed k-space data.

In a well-known manner, processor 106 is configured such that there is sufficient memory for storing measured data and reconstructed images. The memory is sufficient to store the whole of N-dimensional measured data as well as reconstructed data. Also in a well-known manner, an MR image is constructed from the image or k-space data corresponding to a predetermined plurality of applications of a MRI pulse sequence initiated by a RF pulse such as from transmitter 102 of FIG. 1. The image is updated by collecting image or k-space data from repetitive MRI pulse sequences. An MR image is reconstructed by performing a series of Fourier transforms along a set of orthogonal directions in k-space. As used herein, "adapted to", "configured" and the like refer to operation capabilities of electrical elements such as analog or digital computers or application specific devices (such as an application specific integrated circuit (ASIC)) that are programmed to perform a sequel to provide an output in response to given input signals.

As a general description, magnetic resonance imaging (MRI) is a well-known imaging method in which magnetic moments are excited at specific nuclear spin precession frequencies that are proportional to the magnetic field occurring within the magnet of the MRI system. Spin is a fundamental property of nature, such as electrical charge or mass. Precession is a rotational motion about an axis of a vector whose origin is fixed at the origin. The radio-frequency (RF) signals resulting from the precession of these spins are received typically using RF coils in the MRI system and are used to generate images of a volume of interest. A pulse sequence is a selected series of RF pulses and/or magnetic field gradients applied to a spin system to produce a signal representative of some property of the spin system. Described herein are embodiments employing steady-state free precession (SSFP) pulse sequences adapted to discriminate lipids from water. SSFP pulse sequences are generally used for fast imaging without excessive saturation of signals. SSFP pulse sequences are particularly useful for cardiac and cerebral spinal fluid (CSF) imaging applications. MRI pulse sequences that take advantage of steady-state free precession (SSFP), e.g. Siemens' "True-FISP", General Electric's "FIESTA", and Phillip's "Balanced FFE", can rapidly create images characterized by T2*/T1 contrast. The time constant that describes the return to equilibrium of the transverse magnetization, $M_{xy}$, is called the spin-spin relaxation time, T2. T1 governs the rate of recovery of the longitudinal magnetization. T2* is the spin-spin relaxation time composed of contributions from molecular interactions and inhomogeneities in the magnetic field.

In Bloch simulations of SSFP, it has been shown that a variation of steady-state transverse magnetization occurs with chemical shift. Transverse magnetization refers to the XY component of the net magnetization. Chemical shift refers generally to a variation in the resonance frequency of a nuclear spin due to the chemical environment around the nucleus. Chemical shift is typically reported in parts per million (ppm) or Hz.

Figure 2:
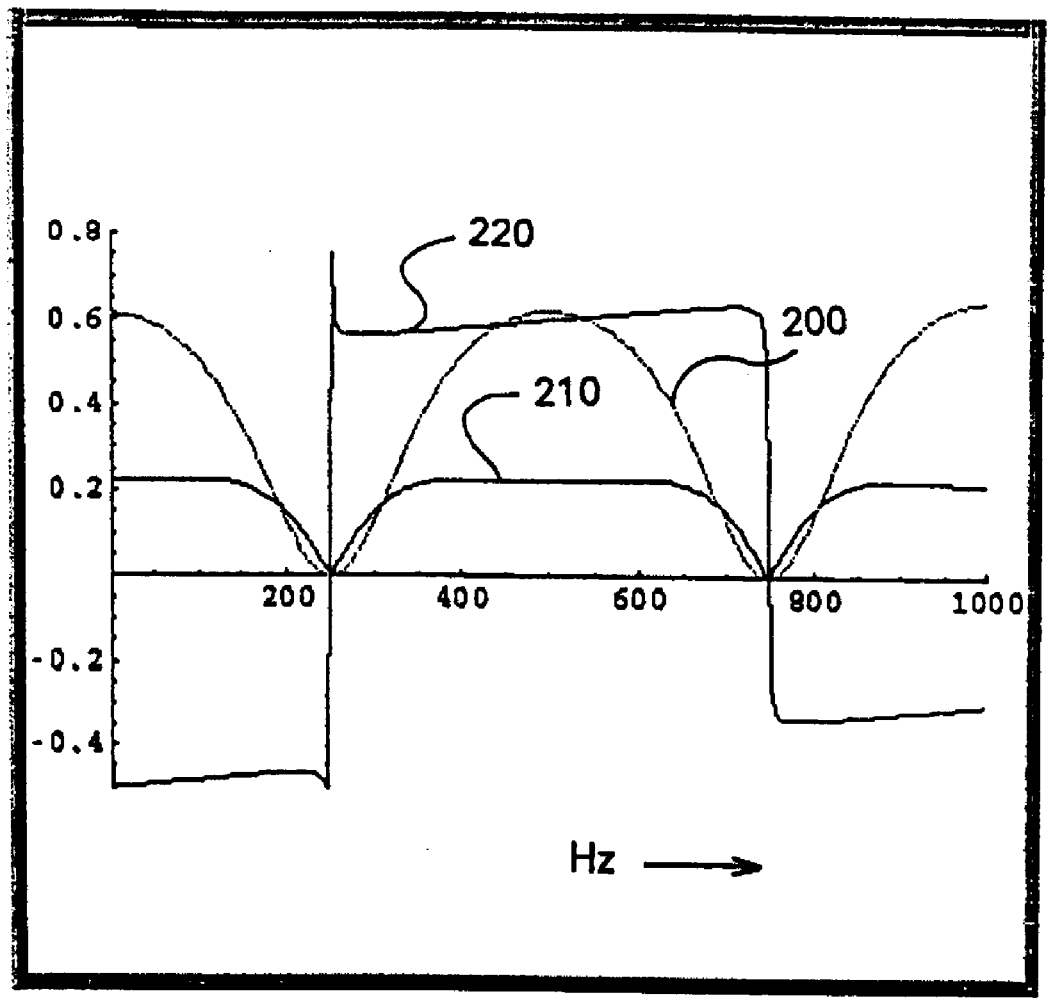
FIG. 2 is a graphical illustration of chemical-shift behavior for a FIESTA steady-state free precession (SSFP) pulse sequence.

The chemical-shift behavior of the FIESTA pulse sequence is shown in FIG. 2. Referring to FIG. 2, exemplary embodiments of longitudinal 200 and transverse 210 magnetization are shown, with phase normalized to $2\pi$ (220), as a function of resonance offset, in Hz, for a FIESTA pulse sequence with TR=2 ms, tip angle 40°, T1=1000 ms, T2=200 ms. The phase of the RF pulse alternates between 0 and $\pi$ in this exemplary embodiment shown in FIG. 2.

Because the magnetization steady state depends sensitively on the phase of the magnetization when each RF pulse is applied, both the longitudinal 200 and transverse 210 magnetization exhibit repeated dips as a function of chemical shift. These dips are periodic at the inverse of the repetition time TR. Tuning of the repetition time can therefore in principle be used to position the first null over the fat resonance (at around 250 Hz at 1.5T), and thus attenuate the fat signal. However, in practice this null region is much too narrow to be useful for this purpose. For embodiments of the present invention, the terms "fat" and "lipid" used herein are to be used interchangeably and refer to matter that exhibit similar chemical shift behavior and can refer to fat tissue and artificial tissue, such as silicone implants and the like.

In a first embodiment of the present invention, a method for acquiring images with water and lipid separation using a magnetic resonance imaging (MRI) system is provided comprising the step of applying a plurality of steady-state free precession (SSFP) radio-frequency (RF) excitation pulses having respective amplitudes that correspond substantially to a binomial distribution to discriminate lipids from water. In this embodiment, it is possible to broaden the null region while maintaining a relatively broad plateau around the water resonance at 0 Hz, by employing a repeating binomial pattern of pulses. The binomial pattern is characterized by a train of pulses of alternating phase, with a characteristic constant time delay between pulses, and with relative amplitudes that follow a binomial distribution (e.g. 1-1, 1-2-1, 1-3-3-1, 1-4-6-4-1, etc.). Each set of repeating binomial pulses starts with the same phase, regardless of whether the binomial sets contain an even or an odd number of pulses. The pulses are applied repeatedly during imaging and signals are acquired at intermediate points between the pulses to produce respective images corresponding to lipids and water. Desirably, the binomial distribution is selected from a group of distributions consisting of 1-1, 1-2-1, 1-3-3-1, and 1-4-6-4-1 but it is to be appreciated by one skilled in the art that other binomial distributions may also be employed. Also, it is to be appreciated that in this embodiment, these pulses are used in the context of a steady-state-free-precession sequence without disrupting the steady state. Thus, separate fat saturation pulses are not needed.

Figure 3A:
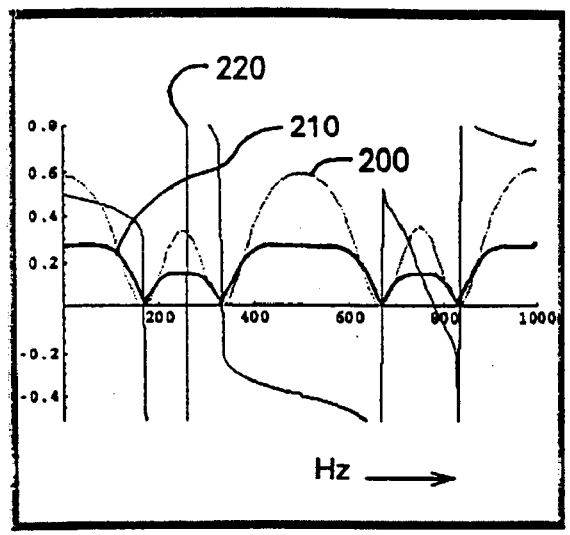
FIG. 3 (A, B, and C) are graphical illustrations of magnetization and phase for the FIESTA pulse sequence of FIG. 2 having a binomial pattern to which embodiments of the present invention are applicable; and, FIG. 4 (A, B) are graphical illustrations of combining magnetization for the binomial pattern of pulses from FIG. 3.
Figure 3B:
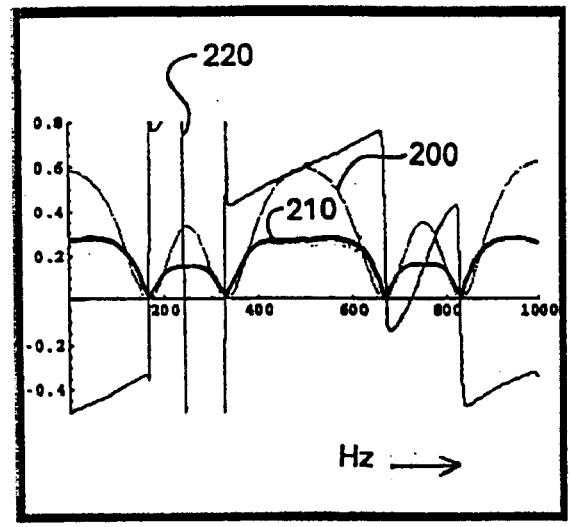
Figure 3C:
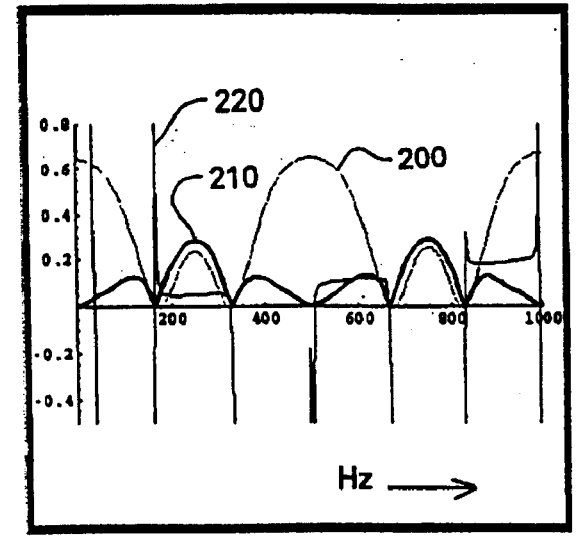

Referring to FIG. 3, magnetization and phase are shown for the FIESTA pulse sequence of FIG. 2, but with RF pulses following a binomial 1-2-1 pattern (with phases 0-$\pi$-0, respectively). The magnetization signal is shown midway between first and second (3A), second and third (3B) and third and succeeding first (3C) pulse in the pattern. Here the "1" pulses have a tip angle of 25° and the "2" pulse 50°. The transverse magnetization signal 210 is shown after the first "1" pulse (FIG. 3A), after the "2" pulse (FIG. 3B), and after the last "1" pulse (FIG. 3C). It can be seen that the first two of these signals show a broadened "null" region around the fat region at 250 Hz. The third signal, particularly the transverse magnetization 210 (FIG. 3C), on the other hand, shows a relatively strong signal at 250 Hz and a weak signal at 0 Hz. These could be used to create water images and fat images, respectively.

Figure 4A:
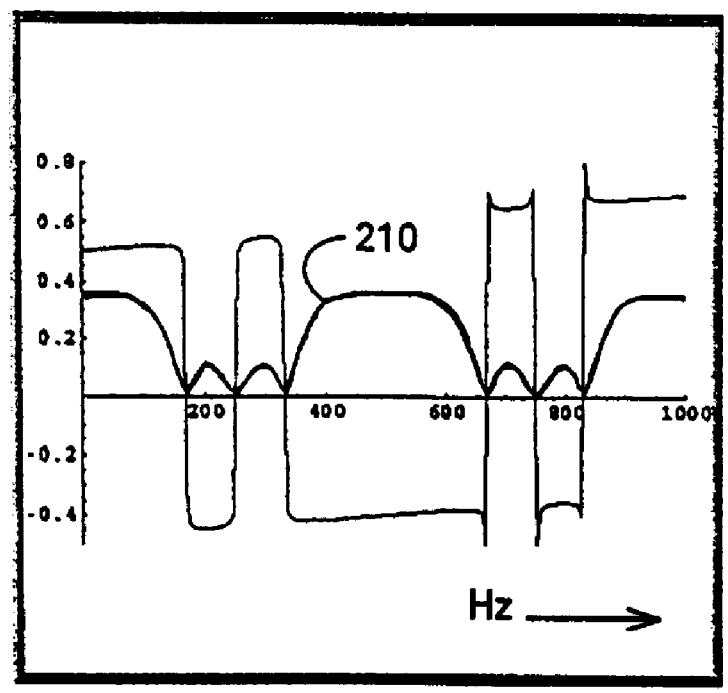
Figure 4B:
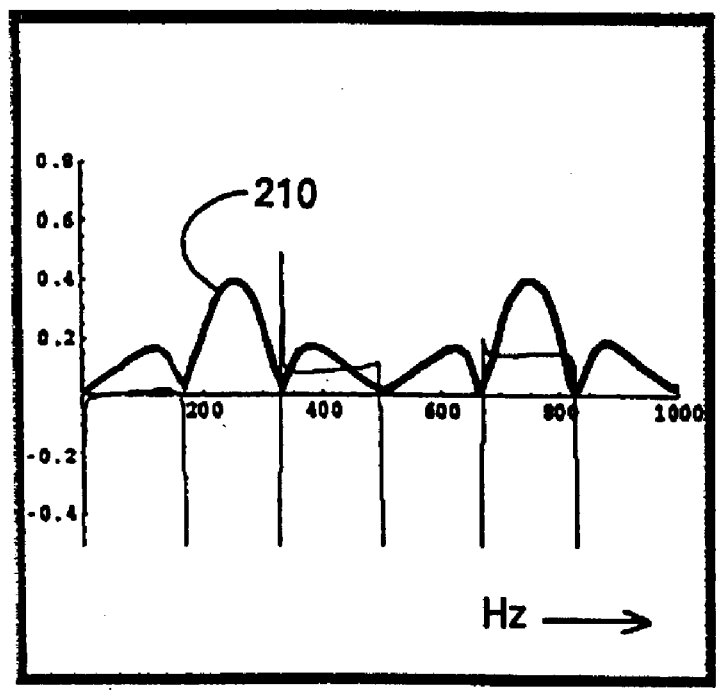

In another embodiment, the method comprises the additional step of combining respective magnetization signals acquired at intermediate points between different pulses in a selected manner to further enhance discrimination of lipids from water. In an exemplary embodiment, the signals acquired by the binomial pattern are selectively combined in a fashion that enhances the discrimination between water and fat, as shown in FIG. 4. FIG. 4 shows combinations of signals from the binomial 1-2-1 SSFP (FIESTA) pulse sequence of FIG. 3, as follows: FIG. 4A.) signal #1 signal #2, FIG. 4B.) signal #1+signal #2signal #3.

Referring to FIG. 4A, the difference between signal #1 (FIG. 3A) and signal #2 (FIG. 3B) is shown. Here the fat region has been suppressed even more relative to the water region. In FIG. 4B, the signals are combined as follows: signal #1+signal#2 signal #3. As is shown, the water signal has been suppressed relative to the fat. FIG. 4 illustrates an exemplary embodiment of selectively combining acquired signals to suppress the water signal relative to the lipid, or alternatively suppressing the fat signal. It is to be appreciated by one skilled in the art that various combinations of magnetization signals may be employed in order to achieve water suppression relative to lipids. In further embodiments, selected combinations are similarly applied to higher order binomial pulses.

Other variations can produce useful changes to the magnetization profile versus chemical shift. In another further embodiment, the distribution of pulse amplitudes consists of a linear combination of phase-alternating binomial patterns. For example, a 1-2-2-1 pattern (with respective phases 0-$\pi$-0-$\pi$) is the phased sum of a 1-3-3-1 pattern and a 1-1 pattern offset (i.e. shifted) by one pulse. In another example, a 1-2-0-2-1 pattern (with respective phases 0-$\pi$-0-0-$\pi$) is the phased sum of a 1-4-6-4-1 pattern and 2 times a 1-3-3-1 pattern offset by one pulse. Also, the binomial distribution can include approximate binomial distributions. For instance, moving the pulse trains away from a strictly binomial intensity pattern (e.g. 1-1.5-1 rather than 1-2-1) yields sharp profiles. Also, going to higher order binomial pulse trains (1-4-6-4-1 and beyond) can expand the range of useful available profiles in the chemical shift spectrum.

In yet a further embodiment, it is possible to arrange to collect constant-phase signals by adjusting the exact time of the data collection. For example, the signal for the 1-2-1 FIESTA sequence of FIG. 3A has been collected halfway between the first "1" pulse and the "2" pulse. There is significant phase roll across the entire chemical shift range. However, if the data collection time is adjusted to be closer to the first "1" pulse than to the "2" pulse, then the broad plateau regions (including the one centered on the water peak at 0 Hz) have less phase roll. For the signal excited after the "2" pulse, the corresponding optimal collection time is closer to the next "1" pulse than to the "2" pulse.

Further in this embodiment, it may be desirable to acquire two signals from symmetrical points in the distribution of RF pulses (e.g., on either side of the "2" pulse in a 1-2-1 distribution; or between the first "1" and the first "3" and between the second "3" and the second "1" in a 1-3-3-1 distribution), and, use the signals to each fill half of k-space to make a single image. As one example, a substantially same total number of lines of k space is acquired, in order to substantially halve the total image acquisition time while keeping image resolution in the phase-encode direction constant. In a further alternative example, twice a total number of lines of k space is acquired, in order to substantially halve the pixel size in the phase-encode direction while keeping the total image acquisition time constant. The signals can also be used to fill different lines of k-space.

Alternatively, the two signals are acquired substantially as half-echoes, with one of the signals filling the left half of a line of k space and the other signal filling the right half of the same line of k space. Here, the respective readout gradients are desirably designed to make the center of the spin echo of each signal correspond to the center of k space. In a further alternative, substantially half of k-space points are sampled within each signal to shorten repetition time TR. Another approach is to sample a same number of k-space points within each signal to increase the image resolution in a given readout direction.

Finally, the use of binomial pulses will yield a faster approach to steady state than the standard pulse sequence of FIG. 2. Advantageously, the binomial sequence comes close to steady state faster than the original sequence, and can reach a higher value of steady-state transverse magnetization.

Furthermore, embodiments for a system for MRI are also provided. The system includes the components of FIG. 1 as described above and further comprises transmitter 102 being adapted to perform according to the methods described herein. An embodiment of a system for Magnetic Resonance Imaging (MRI) for acquiring images of an object comprises a magnetic field driver for driving a field gradient, a magnetic field controller for controlling the magnetic field, a transmitter for generating an radio frequency (RF) pulse to cause resonance and wherein the transmitter is adapted to generate a plurality of steady-state free precession (SSFP) radio-frequency excitation pulses having respective amplitudes that correspond substantially to a binomial distribution to discriminate lipids from water, a receiver for receiving and detecting magnetic resonance signals generated from the object, and, a processor for performing image reconstruction and for generating images for display. As described above with reference to methods for MRI, the binomial distribution is desirably selected from a group of distributions consisting of 1-1, 1-2-1, 1-3-3-1, and 1-4-6-4-1. In a further embodiment, processor 106 is adapted to combine respective acquired magnetization signals corresponding to the plurality of pulses in a selected manner to further enhance discrimination of lipids from water. In a further embodiment, processor 106 is adapted to sample magnetization signals occurring between the respective RF pulses and further combine the intermediate magnetization signals in a selected manner to enhance discrimination of lipids from water. The binomial distribution may also comprise approximate binomial distributions, for example 1-1.5-1. Thus, transmitter 102 is desirably adapted to generate and apply during imaging with the MRI system a plurality of steady-state free precession (SSFP) radio-frequency (RF) excitation pulses having respective amplitudes that correspond substantially to a binomial distribution to discriminate lipids from water. Further, processor 106 of FIG. 1 is adapted to combine in a selected manner and sample acquired signals as described herein in order to further enhance discrimination of water from fat, or lipids.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for acquiring images with water and lipid separation using a magnetic resonance imaging (MRI) system, the method comprising:

applying during imaging with the MRI system a plurality of steady-state free precession (SSFP) radio-frequency (RF) excitation pulses having respective amplitudes that correspond substantially to a binomial distribution to discriminate lipids from water; and, combining respective acquired magnetization signals corresponding to intermediate points between the plurality of pulses in a selected manner to further enhance discrimination of lipids from water.

2. The method of claim 1 wherein the pulses are applied repeatedly during imaging to produce respective images corresponding to lipids and water.

3. The method of claim 1 wherein the binomial distribution is selected from a group of distributions consisting of 1-2-1, 1-3-3-1, and 1-4-6-4-1.

4. The method of claim 3 wherein the binomial distribution further comprises an approximate binomial distribution.

5. The method of claim 4 wherein the approximate binomial distribution is 1-1.5-1.

6. The method of claim 1 wherein the plurality of pulses are configured to alternate in phase.

7. The method of claim 1 wherein the binomial distribution is selected from a group of distributions consisting of 1-2-1, 1-3-3-1, and 1-4-6-4-1.

8. The method of claim 1 wherein the plurality of pulses has amplitudes consisting of a linear combination of phase-alternating binomial patterns.

9. The method of claim 8 wherein the distribution is selected from a group of distributions consisting of 1-2-2-1 (with respective phases $0$-$\pi$-$0$-$\pi$), and 1-2-0-2-1 (with respective phases $0$-$\pi$-$0$-$0$-$\pi$).

10. The method of claim 1, further comprising the steps of:

acquiring two signals from symmetrical points in the distribution of RF pulses; and, using the signals to fill half of k-space to make a single image.

11. The method of claim 10, wherein the two signals are acquired substantially as half-echoes, with one of the signals filling the left half of a line of k space and the other signal filling the right half of the same line of k space.

12. The method of claim 11, wherein respective readout gradients are designed to make the center of the spin echo of each signal correspond to the center of k space.

13. The method of claim 11, wherein substantially half of k-space points are sampled within each signal to shorten repetition time TR.

14. The method of claim 11, wherein a same number of k-space points is sampled within each signal to increase the image resolution in a readout direction.

15. The method of claim 10, wherein the two signals are used to fill different lines of k space.

16. The method of claim 15, wherein a substantially same total number of lines of k space is acquired, in order to substantially halve the total image acquisition time while keeping image resolution in the phase-encode direction constant.

17. The method of claim 15, wherein twice a total number of lines of k space is acquired, in order to substantially halve the pixel size in the phase-encode direction while keeping the total image acquisition time constant.

18. A method for acquiring images with water and lipid separation using a magnetic resonance imaging (MRI) system, the method comprising:

applying during imaging with the MRI system a plurality of steady-state free precession (SSFP) radio-frequency (RF) excitation pulses having respective amplitudes that correspond substantially to a binomial distribution, the pulses being applied repeatedly during imaging to produce respective images corresponding to lipids and water; and, combining respective acquired magnetization signals corresponding to intermediate points between the plurality of pulses in a selected manner to further enhance discrimination of lipids from water.

19. The method of claim 18 wherein the binomial distribution is selected from a group of distributions consisting of at least one of 1-2-1, 1-3-3-1, and 1-4-6-4-1.

20. The method of claim 19 wherein the binomial distribution further comprises an approximate binomial distribution.

21. The method of claim 20 wherein the approximate binomial distribution is 1-1.5-1.

22. The method of claim 18 wherein the plurality of pulses are configured to alternate in phase during each binomial set.

23. A system for Magnetic Resonance Imaging (MRI) for acquiring images of an object comprising:

a magnetic field driver for driving a field gradient;

a magnetic field controller for controlling the magnetic field;

a transmitter for generating an radio frequency (RF) pulse to cause resonance and wherein the transmitter is adapted to generate a plurality of steady-state free precession (SSFP) radio-frequency excitation pulses having respective amplitudes that correspond substantially to a binomial distribution to discriminate lipids from water;

a receiver for receiving and detecting magnetic resonance signals generated from the object; and, a processor for performing image reconstruction and for generating images for display and the processor being adapted to combine respective acquired magnetization signals corresponding to intermediate points between the plurality of pulses in a selected manner to further enhance discrimination of lipids from water.

24. The system of claim 23 wherein the binomial distribution is selected from a group of distributions consisting of 1-2-1, 1-3-3-1, and 1-4-6-4-1.

25. The system of claim 23 wherein the binomial distribution further comprises approximate binomial distributions.

26. The system of claim 25 wherein the approximate binomial distribution is 1-1.5-1.

* * * * *